310-322 SR
OR 3,982,143

United St[illegible] T89656

Tamura et al.

[11] 3,982,143

[45] Sept. 21, 1976

[54] PIEZOELECTRIC DIAPHRAGM ELECTRO-ACOUSTIC TRANSDUCER

[75] Inventors: Masahiko Tamura; Takashi Oyaba, both of Tokorozawa, Japan

[73] Assignee: Pioneer Electronic Corporation, Tokyo, Japan

[22] Filed: Feb. 12, 1975

[21] Appl. No.: 549,341

[30] Foreign Application Priority Data

Feb. 18, 1974 Japan .......................... 49-19528[U]

[52] U.S. Cl. .................................. 310/9.1; 310/8.2; 310/8.5

[51] Int. Cl.$^2$ .......................................... H01L 41/08

[58] Field of Search .................. 310/8, 8.2, 8.3, 8.5, 310/8.6, 9.1, 9.4, 9.5, 9.6; 179/110 A, 110 E, 111 R, 111 E

[56] References Cited

UNITED STATES PATENTS

| | | | |
|---|---|---|---|
| 2,549,872 | 4/1951 | Willard | 310/9.6 X |
| 2,565,159 | 8/1951 | Williams | 310/9.6 X |
| 3,832,580 | 8/1974 | Yamamuro et al. | 310/8.3 X |

*Primary Examiner*—Mark O. Budd
*Attorney, Agent, or Firm*—Woodhams, Blanchard and Flynn

[57] ABSTRACT

A piezoelectric electro-acoustic transducer which includes a diaphragm having a piezoelectric property, a base plate of a stiff material, and a resilient backing member which is compressedly covered at one side with the base plate and brought into contact at the other side with the diaphragm to provide the diaphragm with resiliency and/or tension, characterized in that the base plate is provided at one side adjacent said backing member with a surface which has a concave and/or a convex curvature to provide the diaphragm with different suitable pressures through said backing member, whereby it has become possible to improve the frequency characteristics, particularly, the low frequency characteristics of the transducer and a high conversion efficiency thereof.

8 Claims, 2 Drawing Figures

PIEZOELECTRIC DIAPHRAGM ELECTRO-ACOUSTIC TRANSDUCER

This invention relates to a piezoelectric electro-acoustic transducer and more particularly to a piezoelectric electro-acoustic transducer which includes a support means, a piezoelectric diaphragm supported at its edge portions by the support means, and a resilient backing member brought into contact with the diaphragm to impart to the diaphragm a suitable tension and/or resiliency.

It has been proposed to provide a piezoelectric electro-acoustic transducer employing as a diaphragm a thin film which has piezoelectricity. (For example, see U.S. Pat. No. 3,832,580.) Such a piezoelectric film to be used as a diaphragm for electro-acoustic transducer may be prepared by employing a high molecular weight polymer. (See: "Polypeptides Piezoelectric Transducers," by E. Fukuda et al., 6th International Congress on Acoustics, D-31, Tokyo, 1968 and "The Piezoelectricity of Poly(vinylidene Fluoride)," by H. Kawai, Japan, *J. Appl. Phys.* 8, 975, 1969).

Figure 1:
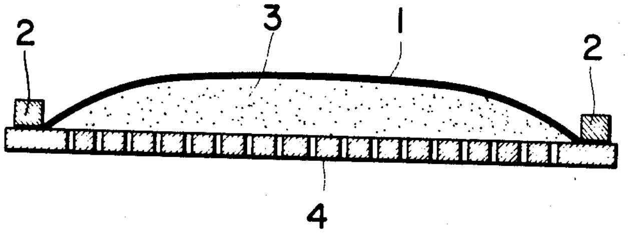
Fig. 1 Prior art

A conventional piezoelectric electro-acoustic transducer of this type comprises, as shown in FIG. 1, a base plate 4, a diaphragm 1 of piezoelectric high polymer film supported at its edge portions by a support means 2, and a resilient backing member 3 brought into contact with the diaphragm to impart a resiliency and/or tension thereto. However, due to its arrangement, the conventional piezoelectric electro-acoustic transducer has a drawback in a sound conversion efficiency. Further, the arrangement of the conventional transducer wherein the resilient backing member 3 uniformly contacts with every portion of the diaphragm is undesirable for the frequency characteristics, specifically in a low frequency range.

An object of this invention is to provide a piezoelectric electro-acoustic transducer which is free from the above mentioned defects and can be assembled without any difficulty, whereby the improved sound characteristics are obtained.

Another object of this invention is to provide a piezoelectric electro-acoustic transducer in which the diaphragm of the transducer is provided with a locally different tension and/or resiliency by the pressure applied by the specifically formed base plate through the resilient backing member.

Essentially, according to the present invention, there is provided a piezoelectric electro-acoustic transducer comprising a support means of a stiff material, a diaphragm having a piezoelectric property and supported at its edge portions by the support means, a base plate of a stiff material, and a resilient backing member compressedly covered at its one side with the base plate and brought into contact at its other side with the diaphragm, characterized in that said base plate is provided with a surface having at least one of a concave and a convex curvature and contacts the backing member to provide the diaphragm with at least one of a tension and resiliency through the backing member.

Figure 2:
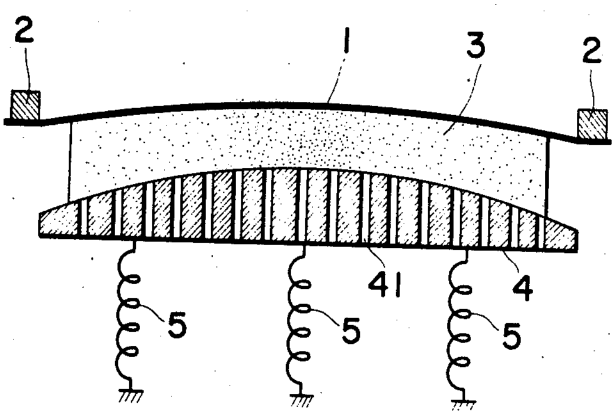

This invention will now be more particularly described with reference to the accompanying drawing in which:

FIG. 1 is a sectional view of the principal structure of a conventional piezoelectric electro-acoustic transducer; and FIG. 2 is a sectional view of the principal structure of a piezoelectric electro-acoustic transducer embodying this invention.

Referring now to FIG. 2, there is provided at numeral 1 a diaphragm made of a high polymer film having a flexibility. The film is made from a synthetic resin such as polyvinylidene fluoride, polyvinyl fluoride, polyvinyl chloride, nylon-11, polypeptide or the like. The film is then subjected to a treatment in which the film is provided with a piezoelectric property.

Numeral 2 indicates a support means of a stiff material adapted to support the diaphragm 1. Numeral 3 indicates a resilient backing member made of such resilient materials as a polyurethane foam having a uniform property or pressure when it does not have applied thereto an external force, and formed in a rectangular parallelepiped. Numeral 4 indicates a base plate of a stiff material provided with a predetermined number of openings 41 of a given size and a surface of convex which contacts with the resilient backing member 3. Numeral 5 indicates a plurality of springs adapted to provide the base plate with pressure. The springs 5 are arranged so that the degree of the pressure can be adjusted.

In the arrangement mentioned above, the resilient backing member 3 directly contacts the diaphragm 1 to impart to the diaphragm the tension and/or resiliency and the resilient backing member 3 is compressedly covered with the base plate 4 formed as shown in FIG. 2. Therefore, the central portion of the diaphragm 1 receives more pressure from the base plate 4 through the resilient backing member 3 than the other portion of the diaphragm 1 due to the convex curvature provided on one side of the base plate 4. Consequently, each portion of the diaphragm 1 receives locally different pressures through the resilient member 3 according to the convexity provided as described above on the one side of the base plate 4 and, as a whole, said diaphragm 1 receives locally different resiliency and/or tension.

The form of the one side of the base plate 4 is not restricted to the concave but the surface may be of any type of irregular form such as a concave, uneven, corrugated one or combination thereof to obtain the similar effect as of the base plate 4 as mentioned above. The base plate 4 may be made of a plastic material such as synthetic resin which does not undergo a deformation due to the stress.

Further, though there is used a resilient backing member 3 made of the polyurethane foam in the embodiment, the materials of the resilient backing member are not restricted to it and any kind of material which has a resiliency may be used for the resilient backing member 3. Furthermore, though in the present embodiment, only one kind of resilient material is used to form the resilient backing member 3, two or more kinds of resilient materials can be used in combination to form the backing member 3.

Though this invention is explained with the embodiment which embodies a piezoelectric speaker, the invention is, of course, applicable to other kinds of electro-acoustic transducers such as a piezoelectric microphone etc. which includes a diaphragm requiring the tension and/or resiliency.

What is claimed is:

1. In a piezoelectric electro-acoustic transducer comprising a support means of a stiff material, a flexible diaphragm having a piezoelectric property and supported at its edge portions by the support means, a base plate of a stiff material, and a resilient backing member compressedly covered at one side with the base plate and brought into contact at its other side with the diaphragm so as to tension and resiliently support the flexible diaphragm, the improvement comprised in that said base plate is provided with a surface curved to be at least one of concave and convex, which curved surface is the base plate surface in contact with the resilient backing member, at least one of the resilient backing and tension of said flexible diaphragm varying locally thereacross due to said curvature of said base plate surface.

2. The apparatus of claim 1 in which the central portion of the diaphragm receives stiffer backing by said resilient backing member than other portions of said diaphragm, so as to improve the low frequency response of said transducer.

3. The apparatus of claim 2 in which the thickness of said resilient backing member and base plate vary oppositely across the width of said transducer.

4. A piezoelectric electro-acoustic transducer, comprising:

- a flexible piezoelectric diaphragm;
- stiff supports fixedly supporting opposed edges of said diaphragm;
- a base plate of stiff material spaced behind said diaphragm;
- a resilient backing member contacting and partly compressed between said backing plate and said flexible diaphragm, said resilient backing member tensioning and shaping said flexible diaphragm between said stiff supports;
- means imparting a greater backing pressure to the central portion of said diaphragm than to other portions of said diaphragm between said stiff supports so as to improve the low frequency characteristic of said transducer.

5. The apparatus of claim 4 in which said imparting means comprise curvature of the diaphragm facing surface of said base plate convexly toward said diaphragm.

6. The apparatus of claim 4 in which said resilient backing member prior to assembly in said transducer is of uniform thickness, said imparting means comprising convex curvature of said base plate toward said diaphragm at a sufficiently small radius as to compress the center of said resilient backing member more than edge portions thereof as said base plate presses said resilient backing member against said diaphragm.

7. The apparatus of claim 6 in which the separation of said diaphragm and the facing base plate surface increases from the center of said diaphragm outward toward its edges.

8. The apparatus of claim 4 in which said resilient backing member is of uniform resiliency and is formed as a rectangular parallel-piped, means adjustably pressing the base plate toward the diaphragm and including springs backing said base plate, said resilient backing member being compressed between said base plate and diaphragm, said imparting means including contact by the diaphragm and base plate to curve opposite surfaces of said resilient backing member with curvatures of different radius.

* * * * *